United States Patent [19]

Black et al.

[11] Patent Number: 5,055,800
[45] Date of Patent: Oct. 8, 1991

[54] FRACTIONAL N/M SYNTHESIS

[75] Inventors: Gregory Black; Alexander W. Hietala, both of Palatine, Ill.

[73] Assignee: Motorola, Inc., Schaumburg, Ill.

[21] Appl. No.: 516,897

[22] Filed: Apr. 30, 1990

[51] Int. Cl.$^5$ .............................................. H03L 7/18
[52] U.S. Cl. ..................... 331/1 A; 307/516; 328/134; 331/25; 331/27; 455/76; 455/119
[58] Field of Search ..................... 331/1 A, 25, 27, 16, 331/17; 455/42, 76, 119; 307/516; 328/133, 134, 155

[56] References Cited

U.S. PATENT DOCUMENTS

| | | | |
|---|---|---|---|
| 4,179,670 | 12/1979 | Kingsbury | 331/10 |
| 4,204,174 | 5/1980 | King | 331/10 |
| 4,360,788 | 11/1982 | Erps et al. | 331/1 A |
| 4,573,023 | 2/1986 | Cok et al. | 331/1 A |
| 4,654,859 | 3/1987 | Kung et al. | 375/1 |
| 4,758,802 | 7/1988 | Jackson | 331/10 |
| 4,800,342 | 1/1989 | Jackson | 331/10 |
| 4,810,977 | 3/1989 | Flugstad et al. | 455/113 X |
| 4,816,774 | 3/1989 | Martin | 331/1 A |
| 4,864,253 | 9/1989 | Zwack | 331/1 A |
| 4,870,384 | 9/1989 | Thomas | 332/123 |

FOREIGN PATENT DOCUMENTS 0038520 10/1981 European Pat. Off. .

OTHER PUBLICATIONS

Brewerton et al., "Defining the Elements of Good Design", Microwaves & RF, Jun. 1984, pp. 79, 81, 83, 85, 124.

Primary Examiner—Siegfried H. Grimm
Attorney, Agent, or Firm—Raymond A. Jenski; Rolland R. Hackbart

[57] ABSTRACT

A frequency synthesizer having a frequency divider and a frequency multiplier in the feedback loop is disclosed. The minimum frequency separation between two adjacent synthesized channels is equal to the reference frequency divided by the multiplication ratio of the multiplier. The division ratio of the frequency divider, which can be analyzed as the sum of an integer and a fractional portion, is varied with time by a digital sequence, resulting in a minimum frequency increment equal to a fraction of the reference frequency. The multiplier acts to reduce the nonlinearities of the frequency synthesizer when the fractional portion of the division ratio causes a large variation in the instantaneous division ratio by reducing the effective division ratio of the loop.

31 Claims, 3 Drawing Sheets

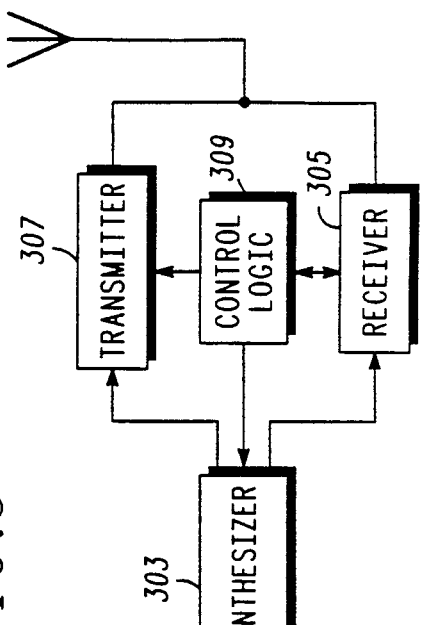
FIG.1 — PRIOR ART —
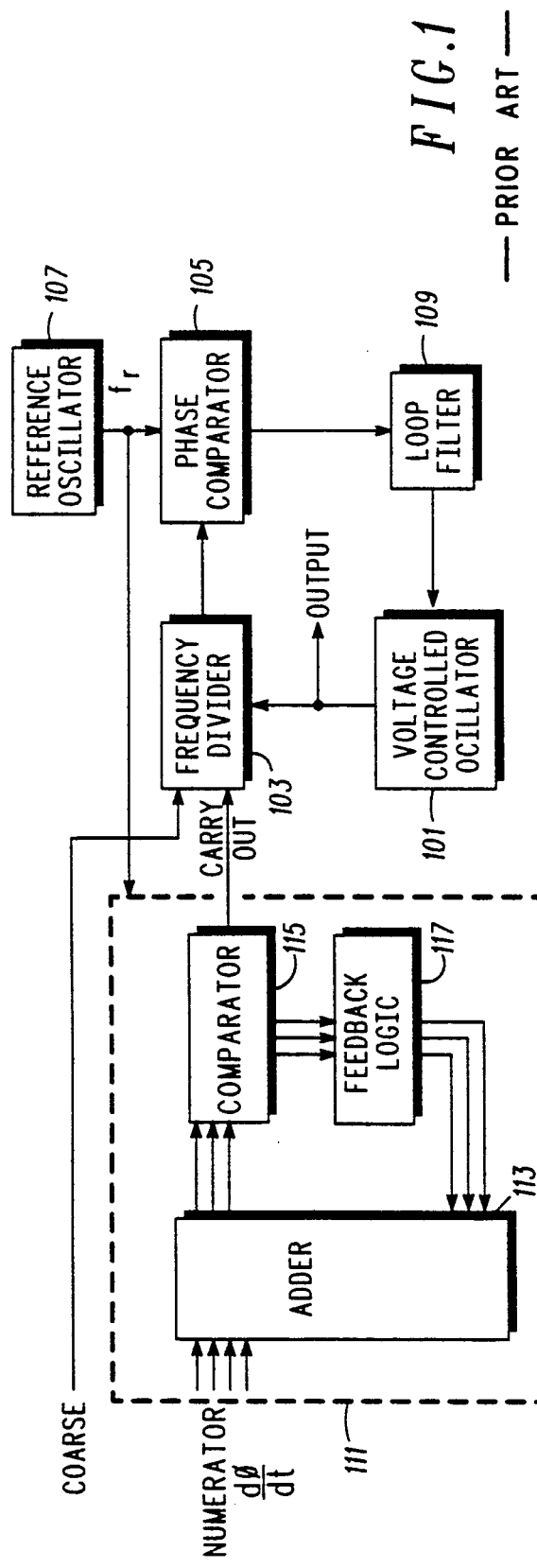
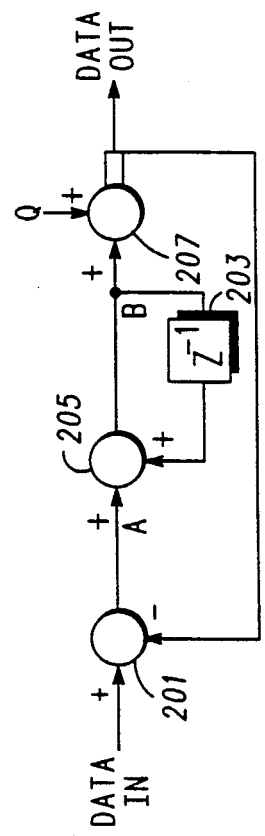
FIG.2 — PRIOR ART —
FIG.3

FRACTIONAL N/M SYNTHESIS

BACKGROUND OF THE INVENTION

This invention relates generally to frequency synthesizers and more particularly to a fractional-N frequency synthesizer where a voltage controlled oscillator (VCO) is controlled by a phase locked loop such that the output frequency, $F_{out}$, is $\overline{N}$ times the reference frequency, $F_{ref}$, divided by a frequency multiplier of value M. That is, $$F_{out} = F_{ref} * \left[ \frac{\overline{N}}{M} \right],$$

where $\overline{N}$ is the average division of the programmable divide-by-N element and M is the multiplicand of a frequency multiplier. This invention may be employed in radiotelephone communications equipment to generate one of a plurality of signals such that a group of equally spaced channels is obtained for use by the radio frequency transceiver.

One conventional method of realizing such a group of channels is to use a bank of highly stable oscillators and merely switch between the various outputs. This system is indeed feasible but would be prohibitively complex and expensive for even a few channels.

Instead of using a bank of highly stable oscillators (e.g. crystal oscillators), a single variable oscillator may be first divided by variable means and fed to one input of a phase comparison device. The other input of the phase comparison device is fed from a highly stable reference oscillator. The output of the phase comparison device may then be filtered to remove any extraneous spurious signal components and fed back to the control input of the variable oscillator. In this manner, a system is formed such that the variable oscillator will phase lock (adjust its frequency) until the phase is aligned resulting in the frequency being equal to the reference frequency times the division number. A group of equally spaced frequency channels is then realized by varying the division ratio. This approach is known as standard phase locked loop (PLL) synthesis.

A shortcoming of this method is that the channel spacing equals the reference frequency. This equality results in noise generated by the phase comparison at frequency offsets equal to the reference frequency and its harmonics. To keep the noise within acceptable limits, the filtering device between the phase comparison and the variable oscillator control input must have a bandwidth much lower than the reference frequency. This low bandwidth results in a clean output, but also slows the transient response of the synthesizer. The transient response needs to be fast in order to track out any short duration noise to the loop or to make the synthesizer useable in a frequency hopping system or to accommodate modulation of the loop.

In order to overcome this limitation, it is desirable to operate the phase detector at a frequency much higher than the desired channel spacing. Such a method has been previously described in U.S. Pat. Nos. 3,928,813; 4,609,881; and 4,816,774. This method is known as fractional N synthesis.

The basic structure of a one-accumulator fractional-N system is shown in the block diagram of FIG. 1. A VCO 101 generates an output signal which, typically is coupled to a fully programmable frequency divider 103 which has an output to a phase detector ($\phi$) 105. The control input to the divider is a summation of a coarse channel setting and the output of the digital network which provides the fractional part of the division. The phase detector 105 conventionally compares the phase of the divided VCO frequency, $f_{vco}$ to the phase of the reference signal frequency $f_{ref}$ output from a reference oscillator 107 to produce a signal which is applied to a loop filter 109 and subsequently to the VCO 101 to phase-lock the VCO output signal.

The selection of the divisor value of variable frequency divider 103 is made by digital network 111 which, in previously known implementations such as described in Z-transform equivalent in U.S. Pat. No. 4,758,802, comprises a conventional adder 113, a comparator 115 (which produces a "carry out" signal when the input to the comparator 115 exceeds a given numerical value), and feedback logic 117 which subtracts the denominator (if a carry output occurs) from the digital number representation output from adder 113 and comparator 115 before applying the digital number representation to the adder 113. A second digital number representation, which in a fractional-N synthesizer is the digital equivalent of the first differential of the offset phase with respect to time (the offset frequency), is applied to another input of the digital network 111. The overall effect of the digital network 111 is to integrate the differential phase and to apply to the PLL a control signal (in the form of a carry-out digital signal) which is a first order equivalent of the phase offset. The adder 113 sums the previous contents of the adder 113 with $d\theta/dt$ (a numerator) on each occurrence of the reference frequency signal $f_{ref}$ As described in U.S. Pat. No. 4,816,774, the adder 113 output is compared is compared to a number (a denominator of a desired fractional part of the divisor when the divisor of frequency divider 103, N, is expressed as a sum of R and [numerator/denominator]). If the adder 113 contents exceed the denominator then the carry output is set true and the contents of the adder is reduced by the denominator in feedback logic 117 before the next reference pulse occurs.

Shown in the Z-transform diagram of FIG. 2 is a Z-transform equivalent digital network 111' of this one accumulator system consistent with that disclosed in U.S. Pat. No. 4,758,802. The Z-transform equation for the single accumulator system is:

$$DO = Z^{-1}DI + Q(1-Z^{-1})$$

The Z-transform adder 201 and 205 is fed from the numerator (minus the denominator if an overflow occurs) and the previous adder contents represented by a $z^{-1}$(delay) block 203. The comparison is considered to be a digital slicer with quantization error Q added at 207. The output from adder 207 is the digital number fed back to adder 201 and the carry out signal is taken as the output signal. For Z-transform analysis, however, no difference need be made between the output and the feedback signals.

At point B an equation can be written as follows.

$$B(z) = B(z)z^{-1} + A(z) \text{ or } B(z) = A(z)/(1-z^{-1})$$

But Data out $= B(z) + Q$ and $A(z) = $ Data in $- B(z) - Q$ Substituting this in and solving for $B(z)$ then:

$$B(z) = \text{Data in}/(2-z^{-1}) - Q/(2-z^{-1})$$

And solving for Data out:

$$\text{Data out} = \text{Data in}/(2-z^{-1}) + Q(1-z^{-1})/(2-z^{-1})$$

This equation may now be converted to the frequency domain (Note that "v" is frequency normalized to the folding frequency):

$$\text{Mag.(Data out/Data in)} = 1/(5-4\cos(PI^*v))^{\frac{1}{2}}$$

$$\text{Mag.(Data out/}Q) = \{(2-2\cos(PI^*v))/(5-4\cos(PI^*v))\}^{\frac{1}{2}}$$

Thus, the data into adder 201 is slightly low pass filtered and the quantization noise introduced by the digital network 111' is high pass filtered. The high pass filtering of the quantization noise has the effect of reducing the spurious signals occurring at the frequency of the channel-to-channel frequency spacing of the transceiver if the spurious occurs at a frequency much below the corner of the high pass. By selecting a PLL response with a low pass corner frequency much lower in frequency than the high pass corner it is possible to reject almost all of the noise. In a single accumulator system, the high pass roll-off is 20 db/decade. Thus the reference frequency must be large to push the high pass corner to large frequencies, if sufficient noise suppression is to be obtained. (Or the PLL low pass must be very low in frequency and thus lose the benefits of wide bandwidth).

The number of accumulators can theoretically be increased to any desired order. The resulting response of the high pass characteristic to the quantization noise will be the number of accumulators times 20 db/decade thereby resulting in an increased rejection of low frequency quantization noise. The accumulators have conventionally been "recombined" in what is known as a "Pascal's triangle method" as disclosed in U.S. Pat. No. 4,609,881. In general, the higher order accumulators are recombined as $(1-Z^{-1})^{(n-1)}$. A two-accumulator fractional-N synthesizer is disclosed in U.S. Pat. No. 4,204,174.

Fractional-N synthesis requires the use of a large amount of digital hardware in order to generate the necessary control sequence for the phase locked loop divider. Any practical realization of a fractional-N system requires integration of the digital functions. Fractional-N synthesis also results in noise components at the channel spacing, but these components are smaller than those produced by a standard PLL. The level of noise in a fractional-N system directly depends on the rate at which the fractional process operates and the number of accumulators. Increasing the number of accumulators and the rate of operation of the fractional-N system decreases the noise components created by increasing the corner frequency and steepening the roll off.

As the rate of operation of a fractional-N system is increased the average total division within the phase locked loop, $\overline{N}$, must be decreased. However, the noise due to phase quantization, which is proportional to the average spacing between the states, $2^*(\pi/\overline{N})$, increases as $\overline{N}$ decreases. In addition, as more accumulators are added the instantaneous variation of the loop division ratio must be increased. These two factors cause a large percentage change in the instantaneous phase locked loop division ratio and thus in the instantaneous phase locked loop gain. This large instantaneous gain variation results in distortion of the desired phase variations in fractional-N synthesis.

SUMMARY OF THE INVENTION

Therefore, it is one object of the present invention to allow a high rate of operation of a fractional-N frequency synthesis system with multiple accumulators without causing large instantaneous loop gain variations.

It is another object of the present invention to increase the PLL bandwidth to obtain better lock time, modulation capabilities, and tracking capabilities while maintaining superior noise performance.

These and other objects are achieved in the present invention which encompasses a phase lock frequency synthesizer which divides the frequency of the signal output from a variable frequency oscillator, frequency multiplies the frequency divided output signal, and phase compares the frequency divided and multiplied signal to the synthesizer reference signal.

BRIEF DESCRIPTION OF THE DRAWINGS

FIG. 1 is a block diagram of a fractional-N synthesizer having one accumulator.

FIG. 2 is a Z-transform diagram of the digital network forming the accumulator of FIG. 1.

FIG. 3 is a block diagram of a radio transceiver which may employ the present invention.

DETAILED DESCRIPTION OF THE PREFERRED EMBODIMENT

Figure 4:
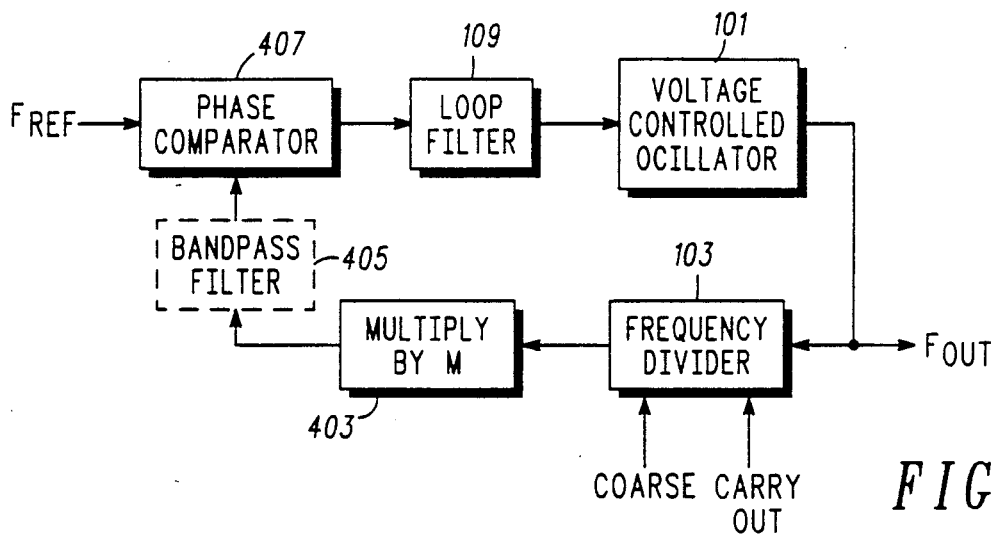
FIG. 4 is a block diagram of a frequency synthesizer which employs the present invention.

A transceiver which may employ the present invention is shown in the block diagram of FIG. 3. One such digital radio transceiver is useful in a digital radiotelephone system such as the GSM Pan-European digital radiotelephone system. In the digital transceiver of FIG. 3, a reference oscillator 301 provides a reference signal, $f_{ref}$ which remains relatively constant in frequency over time and extremes of environment and is applied to frequency synthesizer 303. The output of the synthesizer is used by both the receiver 305 and the transmitter 307 to produce the local oscillator and the modulated transmit signal, respectively. Control over functions of the transceiver, such as channel of operation frequency, is provided by control logic 309 function.

The synthesizer 303, in the preferred embodiment, comprises a fractional-N synthesizer (which may be of the type described in U.S. patent application Ser. No. 516,993, "Multiaccumulator Sigma Delta Fractional N Synthesis", filed on behalf of Hietala et al. on Apr. 30, 1990 and assigned to the assignee of the present invention) and having a general configuration shown in FIG. 4. The synthesizer of the present invention combines a times-M element 403 with a frequency divider (divide by N') element 103 in the feedback path. The output frequency is determined by the expression, $$F_{out} = F_{ref} * (\overline{N}/M)$$

and the output phase is related to the reference phase by the expression, $$\frac{\phi_{out}}{\phi_{ref}} = \frac{N * G(j\omega,N)}{M}$$

Where the output frequency is generated by controlling the average divider value, $\overline{N}$, which can be represented by the sum of an integer portion, R, and a fractional portion, $$\left[\frac{\text{numerator}}{\text{denominator}}\right]$$

which is multiplied by a multiplication factor, M to yield an effective overall division of $\overline{N}/M$. The instantaneous value, N, for the present invention is defined to be in the range, $R \pm \Delta N$ where $\Delta N$ is the range over which N varies during the division process and which has a magnitude which is related to the number of accumulators in the fractional-N system. The multiplier of the present invention, by multiplying the divided signal by M results in the average divider value, $\overline{N}$, being increased by a factor of M (compared to a system which does not use the M multiplier but uses the same reference frequency), with the consequence of the percentage variation in N being reduced by a factor of M. Hence, the fractional $$\left[\frac{N}{M}\right]$$

approach reduces the problem of variations in loop gain, $G(j\omega,N)$, caused by changes in N by reducing the percentage change in N compared to a system not using the M multiplier such that loop gain variations become negligible.

Since the value of $\Delta N$ has not changed relative to a non-multiplier system, the number of phase states is the same, at $(2*\Delta N)+1$. However, the average spacing between states, $$2 * \frac{\pi}{N}$$

radians, is reduced by a factor of M, which reduces the problem of phase quantization.

In order to realize the multiplication factor of M, the output of the frequency divider 103 is multiplied by a conventional analog multiplier 403 to realize the multiplication factor M. The output of the multiplier 403 may then be filtered by a conventional analog bandpass filter 405 to remove unwanted sidebands before being applied to the phase detector 407.

This embodiment may require that the filter 405, added to reduce the unwanted multiplication sideband terms, be fairly narrow. This narrow bandpass filter 405 on the phase detector 407 input can be analyzed as an equivalent filter on the phase detector output. This transformed filter consequently acts like a loop filter to the PLL and limits the value of M to small numbers or limits the loop bandwidth to a point at which the GSM system specifications could not be met with a direct digital scheme.

As an alternative embodiment, the multiplier 403 may employ a digital multiplication technique such as a synchronously clocked binary rate multiplier. In this case it may be possible to remove the filter 405 and the corresponding constraints on M and the loop bandwidth.

The preferred embodiment of the present invention uses a harmonic of the frequency divider 103 output to lock the loop. This is accomplished by employing a harmonic-responding phase detector for phase detector 407. Such a harmonic-responding phase detector may be found in Gardner, *Phase Lock Techniques*, 2d edition John Wiley, Inc. 1979, p. 122. A conventional harmonic locking digital phase detector will lock to a harmonic even if the divider output is a sine wave with no useful harmonics as long as the digital phase detector bandwidth extends to at least $F_{ref}$ therefore the multiplication is "free".

Figure 5:
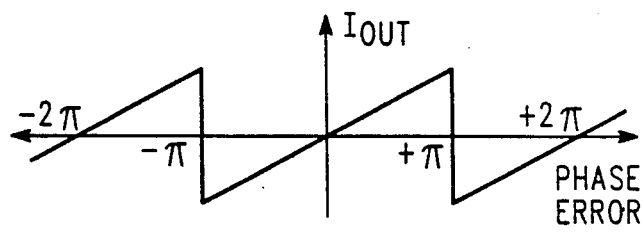
FIG. 5 is a phase comparator output versus phase error graph.

In order to be a harmonic-responding phase detector, the phase detector 407 should exhibit a periodic output versus phase error characteristic such as that shown in FIG. 5. With this type of phase detector, any sub-harmonic of the reference signal could be used to lock the loop. It should be noted that this technique of harmonic-responding phase detection can be applied to loops which do not employ fractional-N synthesis. For example, a standard PLL with 10 kHz channel spacing may be designed with $F_{out}=1$ GHz, $\Delta F$(channel spacing)$=10$ kHz, and $N=100,000$. The reference spurious response signals will occur at offsets of J * 10 kHz, where J is any integer. If $M=10$ with the same output frequency and channel spacing, then if N is still 100,000, the net loop division is $N/M=10,000$, and the reference will operate at 100 kHz. However, if N is stepped by one, then the division steps by 1/M or 0.1. Thus the loop still steps at 10 kHz but with a 100 kHz reference. Therefore the loop is fractionalized by without resorting to standard fractional techniques. The advantages of this system are the same as in standard fractional-N synthesis namely, lower noise floors since the net division is reduced by a factor of M, lower reference spurious signals since the spurious signal frequencies are moved out by a factor of M, and greater resolution of the output frequency for a given reference frequency.

Figure 6:
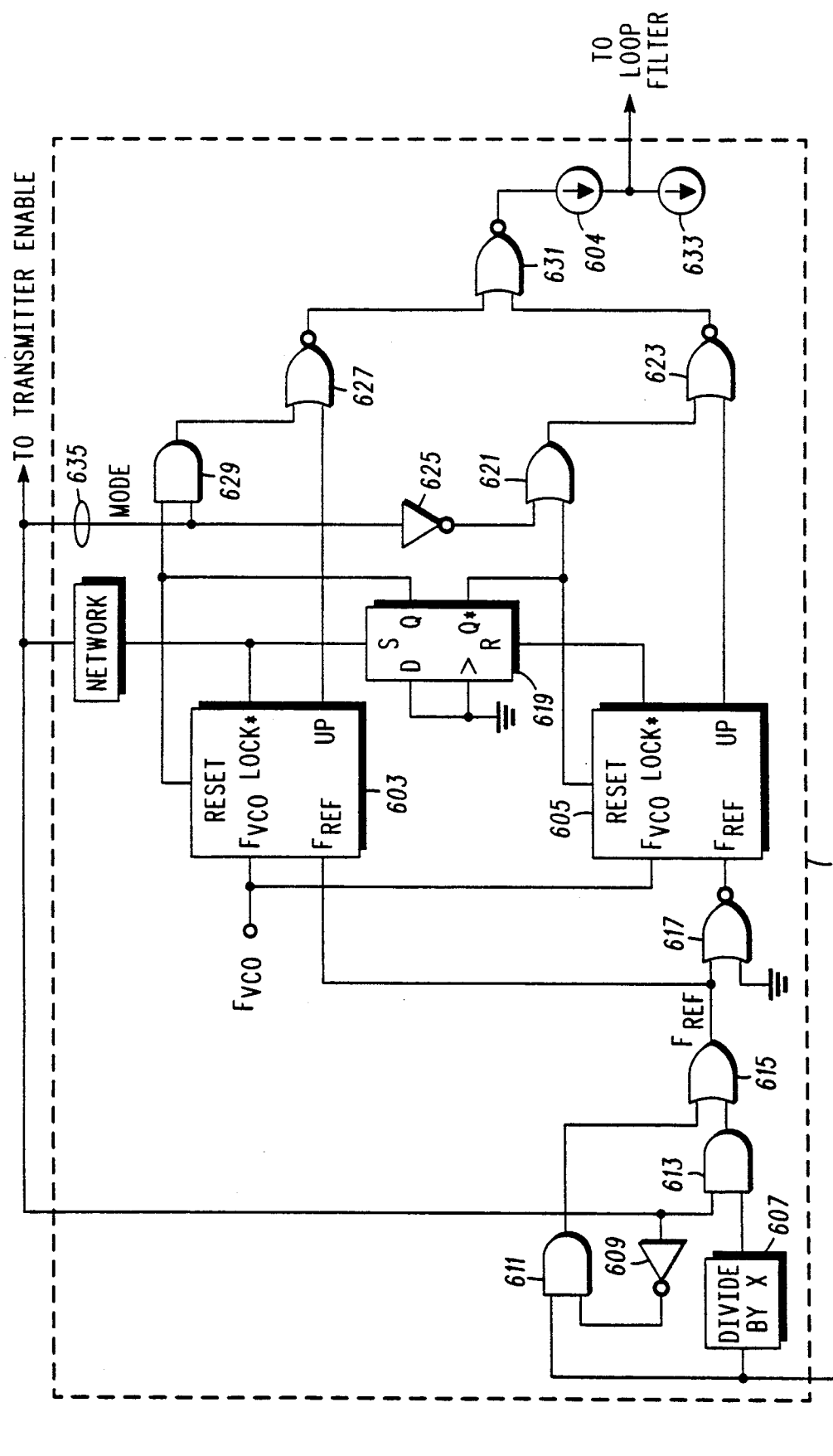
FIG. 6 is a block diagram of a harmonic-locking phase detector which may be employed in the present invention.

The phase detector employed in the preferred embodiment is shown in the block diagram of FIG. 6. This phase detector responds to harmonics of the applied frequency ($F_{vco}$) if the MODE control is set low.

In the preferred embodiment, the harmonic-locking phase detector operates as follows. When the steering mode of the phase detector is activated by setting MODE control high and the reference is divided by X, the PLL achieves lock in a normal manner with reference spurious response signals at the fundamental frequency of $F_{vco}/N$. After lock has been achieved and the MODE is set low, the phase detector switches to the harmonic locking mode and does not divide the reference frequency by X. The PLL then does not change output frequency since the phase detector locks to the $M^{th}$ harmonic of $F_{vco}/N$. Thus the reference spurious signals will move out in frequency by a factor of X and the noise floor will drop by a factor of X. In the preferred embodiment, the values of X and M are equal.

If the logic level MODE is low then the output of the cell 603 will be the output which controls current source 604. This cell 603 by itself is harmonic locking but cannot frequency steer. If MODE is set high then the frequency steering operation of two cells 603 and 605 will result in the phase detector characteristics shown in FIG. 7.

If the LOCK* output of the phase detector cell 603 is brought out then this can be used as an indicator of lock to the transmitter and it can be used to accomplish the mode selection automatically.

If the MODE control signal 635 is low, then the input to AND gate 613 will be low. This state disables AND gate 613 yielding an output which is low so that the $F_{ref}$ signal divided by X by frequency divider 607 will not pass. However, inverter 609 has a high output, so AND gate 611 will pass $F_{ref}$ from reference oscillator 107 through AND gate 611 to the input of OR gate 615. Since the input of OR gate 615 is low due to the output of gate 613, it will pass the reference oscillator to the $F_{ref}$ input of dual state harmonic locking cell 603, to the input of NOR gate 617 (which functions as a simple inverter), and to the reference input of dual state harmonic locking cell 605. If MODE control signal 635 is low, then AND gate 629 is disabled to a low output state thereby blocking signals from the Q output of flip-flop 619. The output of inverter 625 is high causing gate 621 to be high. If gate 621 is high, (the output is true), then NOR gate 623 has an output that is false and blocks signals from cell 605. However, AND gate 629 is low. If AND gate 629 is low, then NOR gate 627 is activated and passes signals from the output of cell 603. NOR gate 623 is inactive and outputs a logic low enabling NOR gate 631 to pass and invert the signal from NOR gate 627. This provides the proper signal to drive current source 604.

Current source 604, when activated feeds a current of 2 $i_0$ where $i_0$ is the current of the lower source 633. Current of the lower source 633 is always active. In this way, when LOCK is achieved, a square wave of current with zero average value is obtained. It will pulse up $i_0$ for half period and pulse down $i_0$ for the other half producing a zero average current.

If the MODE control line 635 is pulled high, then the AND gate 613 is enabled so that the divide by X output of divider 607 passes the divided $F_{ref}$ to the input of OR gate 615. Inverter 609 has a low output which disables AND gate 611 producing a low output. The result is that the reference oscillator 107 signal will be divided by X and will be fed through OR gate 615 to the reference input of cell 603 and to the input of NOR gate 617. Also, if MODE control is high, AND gate 629 is enabled so that data from the Q output of flip flop 619 is passed through AND gate 629. The output of inverter 625 is low, thus data from the Q* output of 619 will be passed through NOR gate 621. Both of the control outputs of flip flop 619 are thus enabled and the data of the UP outputs of either cell 605 or 603 is selected to pass through NOR gate 627 or NOR gate 623 to the output. In this mode, the circuit functions as a steering phase detector because the LOCK detects of cells 603 and 605 cause flip-flop 619 to steer the output of the phase detector which is in lock and lock the output of the phase detector which is not in lock.

In the above system, if LOCK* goes high this signifies that the PLL is out of lock. This then pulls the MODE high which forces the phase detector into the frequency steering mode. In addition the reference input is then selected to divide by M and the transmitter is flagged to stop until LOCK* returns low. The PLL then obtains normal lock at $F_{vco}/N$. When lock is obtained, LOCK* goes low. This result causes the mode to switch to harmonic locking and the reference is not divided by M. The PLL is already locked so when the phase detector changes mode and the reference in frequency jumps by a factor M, no net effect is seen.

Figure 8:
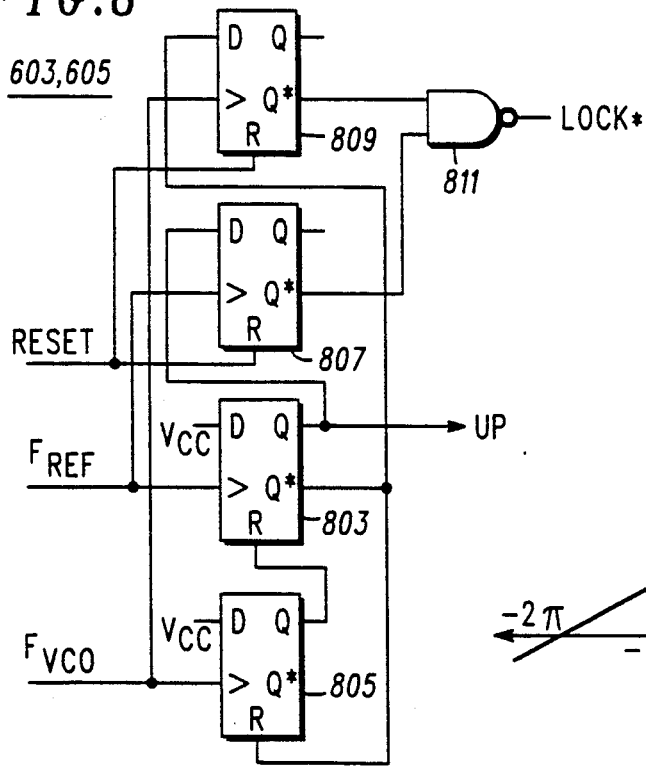
FIG. 8 is a block diagram of a harmonic-locking phase detector cell which may be employed in the harmonic-locking phase detector of FIG. 7

A harmonic-locking phase detector cell, such as cell 603, is shown in detail in the block diagram of FIG. 8. The harmonic locking phase detector cell will not by itself steer the loop to the desired frequency unless the phase detector cell is within $\pm\pi$ radians (or $\pm 2\pi$ depending on the phase detector) of the desired harmonic to begin with.

In the harmonic-locking phase detector cell, the reference frequency signal, $F_r$, is applied to the clock input of conventional D flip flop 803. If $F_r$ rises before $F_{vco}$ (which is applied to the clock input of conventional D flip flop 805) then a pulse of width equal to the difference in time between the rising edges $F_r$ and $F_{vco}$ will appear on the UP line. If $F_{vco}$ rises before $F_r$ then no pulse will be generated. If two $F_r$ pulses occur without an intervening $F_{vco}$ pulse then the Q* output of conventional D flip flop 807 goes low which in turn causes the LOCK* output from AND gate 811 to go high signifying that the range of the phase detector has been exceeded. (Or if two $F_{vco}$ pulses occur without an intervening $F_r$ pulse then the Q* output of conventional D flip flop 809 goes low which in turn causes the LOCK* from AND gate 811 to go high).

Figure 7:
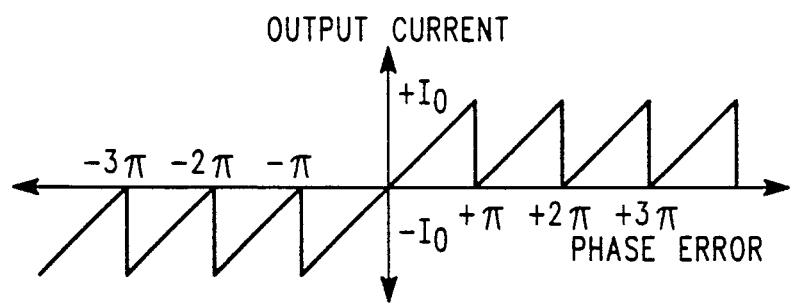
FIG. 7 is a harmonic-locking phase detector output versus phase error graph.

As previously noted, this harmonic-locking phase detector cell does not steer if the frequency offset is great enough to cause a phase error outside of the range 0 to $2\pi$. In the harmonic-responding phase detector of FIG. 6, there are two such dual state cells 603 and 605. One cell 603 is fed 180 degrees out of phase from the other cell 605. Thus when one cell reaches the end of its range the LOCK* signal is used to switch to the other cell which will still be in range. The characteristic of this system is shown in FIG. 7.

We claim:

1. A frequency synthesizer which phase locks an output signal of a variable frequency oscillator to a reference signal, the frequency synthesizer comprising:
   means, coupled to the variable frequency oscillator, for dividing the frequency of the output signal to produce a frequency divided signal;
   means, coupled to said means for dividing, for frequency multiplying said frequency divided signal to produce a frequency divided and multiplied signal; and
   means, coupled to said means for frequency multiplying, for comparing the phase of said frequency divided and multiplied signal to the phase of the reference signal to produce a control signal which is coupled to the variable frequency oscillator.

2. A frequency synthesizer in accordance with claim 1 wherein said means for dividing further comprises means for programmably selecting the divisor value in response to a frequency control signal.

3. A frequency synthesizer in accordance with claim 2 wherein said frequency control signal is a periodic sequence for a fractional-N synthesizer.

4. A frequency synthesizer in accordance with claim 1 wherein said means for frequency multiplying further comprises means for programmably selecting the multiplier value.

5. A frequency synthesizer in accordance with claim 1 wherein said means for frequency multiplication further comprises an analog multiplier.

6. A frequency synthesizer in accordance with claim 1 wherein said means for frequency multiplication further comprises a digital multiplier.

7. A frequency synthesizer in accordance with claim 1 further comprising a band pass filter coupled to said means for frequency multiplying for filtering said frequency divided and multiplied signal.

8. A frequency synthesizer which phase locks an output signal of a variable frequency oscillator to a reference signal, the frequency synthesizer comprising:
   means, coupled to the variable frequency oscillator, for dividing the frequency of the output signal to produce a frequency divided signal;
   means, coupled to said means for dividing, for essentially frequency multiplying said frequency divided signal and for comparing the phase of said frequency divided and multiplied signal to the phase of the reference signal to produce a control signal which is coupled to the variable frequency oscillator.

9. A frequency synthesizer in accordance with claim 8 wherein said means for essentially frequency multiplying and comparing further comprises a harmonic locking phase detector.

10. A frequency synthesizer in accordance with claim 8 wherein said means for dividing further comprises means for programmably selecting the divisor value in response to a frequency control signal.

11. A frequency synthesizer in accordance with claim 10 wherein said frequency control signal is a periodic sequence for a fractional-N synthesizer.

12. A frequency synthesizer in accordance with claim 8 wherein said means for essentially frequency multiplying and comparing further comprises means for frequency dividing the reference signal.

13. A frequency synthesizer in accordance with claim 12 wherein said means for essentially frequency multiplying and comparing further comprises:
   means, switchably responsive to a mode control signal, for coupling the reference signal to the output of said means for coupling when said mode control signal is in a first state and for coupling said frequency divided reference signal to the output of said means for coupling when said mode control signal is in a second state; and
   means, switchably responsive to said mode control signal, for steering said means for essentially frequency multiplying and comparing to the fundamental of said frequency divided reference signal when said mode control signal is in said second state and for steering said means for essentially frequency multiplying and comparing to a harmonic of said frequency divided reference signal when said mode control signal is in said first state.

14. A radio transceiver having a frequency synthesizer which phase locks an output signal of a variable frequency oscillator to a reference signal, the radio transceiver comprising:
   means for transmitting a radio frequency signal of a frequency related to the output signal of the variable frequency oscillator;
   means, coupled to the variable frequency oscillator, for dividing the frequency of the output signal to produce a frequency divided signal;
   means, coupled to said means for dividing, for frequency multiplying said frequency divided signal to produce a frequency divided and multiplied signal; and
   means, coupled to said means for frequency multiplying, for comparing the phase of said frequency divided and multiplied signal to the phase of the reference signal to produce a control signal which is coupled to the variable frequency oscillator.

15. A radio transceiver in accordance with claim 14 wherein said means for dividing further comprises means for programmably selecting the divisor value in response to a frequency control signal whereby said radio frequency signal may be selected from one of a plurality of radio signal frequencies.

16. A radio transceiver in accordance with claim 15 wherein said frequency control signal is a periodic sequence for a fractional-N synthesizer.

17. A radio transceiver in accordance with claim 14 wherein said means for frequency multiplying further comprises means for programmably selecting the multiplier value.

18. A radio transceiver having a frequency synthesizer which phase locks an output signal of a variable frequency oscillator to a reference signal, the radio transceiver comprising:
   means for transmitting a radio frequency signal of a frequency related to the output signal of the variable frequency oscillator;
   means, coupled to the variable frequency oscillator, for dividing the frequency of the output signal to produce a frequency divided signal;
   means, coupled to said means for dividing, for essentially frequency multiplying said frequency divided signal and for comparing the phase of said frequency divided and multiplied signal to the phase of the reference signal to produce a control signal which is coupled to the variable frequency oscillator.

19. A radio transceiver in accordance with claim 18 wherein said means for frequency multiplying and comparing further comprises a harmonic locking phase detector.

20. A radio transceiver in accordance with claim 18 wherein said means for dividing further comprises means for programmably selecting the divisor value in response to a frequency control signal.

21. A radio transceiver in accordance with claim 20 wherein said frequency control signal is a periodic sequence for a fractional-N synthesizer.

22. A radio transceiver in accordance with claim 18 wherein said means for essentially frequency multiplying and comparing further comprises means for frequency dividing the reference signal.

23. A radio transceiver in accordance with claim 22 wherein said means for essentially frequency multiplying and comparing further comprises:
   means, switchably responsive to a mode control signal, for coupling the reference signal to the output of said means for coupling when said mode control signal is in a first state and for coupling said frequency divided reference signal to the output of said means for coupling when said mode control signal is in a second state; and
   means, switchably responsive to said mode control signal, for steering said means for essentially frequency multiplying and comparing to the fundamental of said frequency divided reference signal when said mode control signal is in said second state and for steering said means for essentially frequency multiplying and comparing to a harmonic of said frequency divided reference signal when said mode control signal is in said first state.

24. A method of synthesizing a signal having a predetermined frequency by phase locking an output signal of a variable frequency oscillator to a reference signal, the method comprising the steps of:

dividing the frequency of the output signal of the variable frequency oscillator to produce a frequency divided signal;

frequency multiplying said frequency divided signal to produce a frequency divided and multiplied signal; and comparing the phase of said frequency divided and multiplied signal to the phase of the reference signal to produce a control signal which is coupled to the variable frequency oscillator.

25. A method in accordance with the method of claim 24 wherein said dividing step further comprises the step of programmably selecting the divisor value in response to a frequency control signal.

26. A method in accordance with the method of claim 24 wherein said frequency multiplying step further comprises the step of programmably selecting the multiplier value.

27. A method in accordance with the method of claim 24 further comprising the step of band pass filtering said frequency divided and multiplied signal.

28. A method of synthesizing a signal having a predetermined frequency by phase locking an output signal of a variable frequency oscillator to a reference signal, the method comprising the steps of:

dividing the frequency of the output signal of the variable frequency oscillator to produce a frequency divided signal;

selecting a frequency multiple of said frequency divided signal and comparing the phase of said frequency divided and multiplied signal to the phase of the reference signal to produce a control signal which is coupled to the variable frequency oscillator.

29. A method in accordance with the method of claim 28 wherein said step of dividing further comprises the step of programmably selecting the divisor value in response to a frequency control signal.

30. A method in accordance with the method of claim 28 further comprising the step of frequency dividing the reference signal.

31. A method in accordance with the method of claim 30 wherein said step of selecting a frequency multiple and comparing further comprises the steps of:

selecting, in response to a mode control signal, the reference signal as an output of said selecting a frequency multiple and comparing step when said mode control signal is in a first state and coupling said frequency divided reference signal as an output of said frequency multiplying and comparing step when said mode control signal is in a second state; and steering, in response to said mode control signal, said step of selecting a frequency multiple and comparing to the fundamental of said frequency divided reference signal when said mode control signal is in said second state and steering said step of selecting a frequency multiple and comparing to a harmonic of said frequency divided reference signal when said mode control signal is in said first state.

* * * * *